United States Patent
Koo

(10) Patent No.: US 7,402,864 B2
(45) Date of Patent: Jul. 22, 2008

(54) METHOD FOR FORMING A DRAM SEMICONDUCTOR DEVICE WITH A SENSE AMPLIFIER

(75) Inventor: Dong Chul Koo, Kyoungki-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 107 days.

(21) Appl. No.: 11/498,483

(22) Filed: Aug. 3, 2006

(65) Prior Publication Data

US 2007/0148850 A1 Jun. 28, 2007

(30) Foreign Application Priority Data

Dec. 28, 2005 (KR) .................. 10-2005-0132144

(51) Int. Cl.
*H01L 21/8242* (2006.01)
(52) U.S. Cl. .................. 257/338; 257/E27.097; 438/200; 438/533
(58) Field of Classification Search .......... 257/338, 257/E27.097; 438/200, 533
See application file for complete search history.

(56) References Cited

U.S. PATENT DOCUMENTS

| 6,664,634 B2* | 12/2003 | Thompson et al. .......... 257/758 |
| 2005/0001254 A1* | 1/2005 | Hidaka et al. ............. 257/296 |
| 2005/0242441 A1* | 11/2005 | Thompson et al. .......... 257/758 |

FOREIGN PATENT DOCUMENTS

| JP | 11-168192 | 6/1999 |
| KR | 1019970048911 | 7/1997 |
| KR | 1019980015453 | 5/1999 |
| KR | 1020050087013 | 8/2005 |

* cited by examiner

*Primary Examiner*—George Fourson
(74) *Attorney, Agent, or Firm*—Ladas & Parry LLP

(57) ABSTRACT

A method for forming a sense amplifier of a semiconductor device prevents bit lines from being bridged to each other by a stepped portion created on an insulation interlayer due to irregular density of a P-type impurity, which is ion-implanted into an insulation interlayer in a P+ pickup region when a sense amplifier of a semiconductor device is formed. Yield ratio of semiconductor devices is improved.

4 Claims, 14 Drawing Sheets

<a-a' line sectional>

METHOD FOR FORMING A DRAM SEMICONDUCTOR DEVICE WITH A SENSE AMPLIFIER

FIELD OF THE INVENTION

The present invention relates to a method for forming a sense amplifier of a semiconductor device. More particularly, the present invention relates to a method for preventing bit lines from being bridged to each other above a P+ pickup region when a sense amplifier is formed as a signal amplification device.

BACKGROUND OF THE INVENTION

Among semiconductor devices, a DRAM includes a cell region, a peripheral circuit region, and a core region. The cell region is used to store data. The peripheral circuit region is used to convert an external voltage into an internal voltage or mediate signal transmission inside and outside a semiconductor chip, including a cell. The core region is used, when data is to be written in a cell or data stored in a cell is to be read, to selectively control word and bit lines connected to the corresponding cell.

In general, a pattern having the smallest width is formed in the cell region of a DRAM, and the peripheral circuit region is provided with a pattern having a larger width and free area than those of the cell region. The core region is provided with an amplification device referred to as a sense amplifier, which includes very complicated circuits. This means that the core region requires a fine design rule comparable to that of the cell region. In some cases, the pattern in the core region is smaller than that in the cell region, due to the current trend towards high integration of devices.

A conventional method for forming a sense amplifier will now be described with reference to FIGS. 1A to 1E.

FIGS. 1A and 1E are top views showing a series of process steps used in a conventional method for forming a sense amplifier.

Referring to FIG. 1A, a device isolation layer 110 is formed in a sense amplifier formation region of a semiconductor substrate 100 so that an active region for forming a sense amplifier is delimited. The active region includes an NMOS formation region 120a, a PMOS formation region 130a, an N+ pickup formation region 120b, and a P+ pickup formation region 130b.

A gate insulation layer, a gate conduction layer, and a hard mask layer are laminated on the substrate so as to form gates 140 in a ring shape. Particularly, N-type gates are formed in the NMOS and PMOS formation regions, and those of the gates 140 formed on the device isolation layer 110 outside the active region are supposed to have contacts between the gates 140 and a wiring.

Referring to FIG. 1B, a buffer oxide layer (not shown) and a spacer nitride layer (not shown) are successively formed on the front surface of the resulting substrate, which have the gates 140 formed thereon. Then, an insulation layer (not shown) is formed on the spacer nitride layer so as to cover the gates.

A first mask pattern M1, which has line-type openings for exposing the NMOS formation region 120a and the N+ pickup formation region 120b, is formed on the insulation layer. The insulation layer in the exposed NMOS formation region 120a and N+ pickup formation region 120b is etched by using the first mask pattern M1 as an etching mask. The underlying spacer nitride layer and buffer oxide layer are subjected to anisotropic etching so that spacers (not shown) are formed on lateral walls of the gates 140 while exposing the active region of the substrate among the gates 140, as well as the N+ pickup formation region 120b.

An N-type impurity is ion-implanted into the active region of the substrate, which has been exposed among the gates 140 in the NMOS formation region 120a, and into the exposed N+ pickup formation region 120b so as to form an N+ junction region 150a and an N+ pickup region 150b.

Referring to FIG. 1C, the first mask pattern M1 is removed, and a second mask pattern M2, which has line-type openings for selectively exposing the PMOS formation region 130a and a part of the P+ pickup formation region 130b, is formed on the front surface of the resulting substrate. The insulation layer in the exposed PMOS formation region 130a and P+ pickup formation region 130b is etched by using the second mask pattern M2 as an etching mask. The underlying spacer nitride layer and buffer oxide layer are subjected to anisotropic etching so that spacers (not shown) are formed on the lateral walls of the gates 140 while exposing the active region of the substrate among the gates 140, as well as the P+ pickup formation region 130b.

A P-type impurity is ion-implanted into the active region, which has been exposed among the gates 140 in the PMOS formation region 130a, and into the exposed P+ pickup formation region 130b so as to form a P+ junction region 160a and an P+ pickup region 160b.

The second mask pattern M2 is designed so as to cover intermediate parts of the P+ pickup formation region 130b so that a pattern of laminated buffer oxide layer, spacer nitride layer, and insulation layer remains on the covered parts. This is for the purpose of connecting a pattern of laminated buffer oxide layer, spacer nitride layer, and insulation layer, which remains to the left of the P+ pickup formation region 130b, to that remaining to the right thereof. The resulting pattern of laminated buffer oxide layer, spacer nitride layer, and insulation layer has a locally H-shaped configuration.

If the second mask pattern M2 leaves the P+ pickup formation region 130b completely exposed, i.e. if no pattern of laminated buffer oxide layer, spacer nitride layer, and insulation layer remains in the P+ pickup formation region 130b, the patterns of laminated buffer oxide layer, spacer nitride layer, and insulation layer, which remain to the left and right of the P+ pickup formation region 130b, respectively, are elongated in y-axis direction without a supporter extending in x-axis direction and connecting them to each other. This means that the left and right patterns are structurally unstable, i.e. likely to deform. Therefore, the second mask pattern M2 must cover parts of the P+ pickup formation region 130b. It is to be noted that no bit line contact hole is formed on the covered parts at a later time.

Although the pattern of laminated buffer oxide layer, spacer nitride layer, and insulation layer, which remains between the N+ pickup region 150b and the PMOS region, is elongated in the y-axis direction, there is no possibility that the pattern may deform, because it makes contact with the gates 140 in the PMOS region.

Referring to FIG. 1D, the second mask pattern M2 is removed, and a first insulation interlayer is formed so as to cover the resulting substrate. The first insulation interlayer is subjected to etch-back or CMP (chemical mechanical polishing) until the gates 140 are exposed. A second insulation interlayer is formed on the first insulation interlayer. Predetermined portions of the first and second insulation interlayers are etched so as to form bit line contact holes 170 for exposing the N+ junction region 150a, the P+ junction region 160a, the N+ pickup region 150b, and the P+ pickup region 160b, respectively. In addition, bit line contact holes 170 are also formed so as to expose the gates 140 formed on the device isolation layer 110 outside the active region.

A third mask pattern M3 is formed on the resulting substrate, which has the bit line contact holes 170 formed thereon, in the same manner as the second mask pattern M2. Particularly, the third mask pattern M3 has line-type openings for exposing the P+ junction region 160a and a part of the P+ pickup region 160b, but does not expose intermediate parts of the P+ pickup region 160b.

Additional ion implantation is performed inside the bit line contact holes 170 in the P+ junction region 160a and the P+ pickup region 160b, which have been exposed by the third mask pattern M3. In general, the additional ion implantation is performed only in the P+ junction region 160a and the P+ pickup region 160b, but not in the NMOS region and the N+ pickup region 150b. This is because the P-type impurity resolves more easily than the N-type impurity, and the resulting increase in contact resistance in the P+ junction region 160a and the P+ pickup region 160b must be compensated for. In other words, additional ion implantation in the region, which is supposed to have contacts formed therein, increases the doping density of the contact interface and decreases the contact resistance.

The additional ion implantation is not performed inside the bit line contact holes 170, which are formed on the gates 140 outside the active region, because ion implantation of a P-type impurity into the gates 140, which are N-type gates, increases the resistance.

Referring to FIG. 1E, the third mask pattern M3 is removed, and a cleaning process is performed so as to remove impurities from inside the bit line contact holes 170. During the cleaning process, the second insulation interlayer outside the bit line contact holes 170 partially loses its thickness.

Although not shown in the drawings, a bit line conduction layer is deposited on the second insulation interlayer by using tungsten, for example, so as to fill the bit line contact holes 170, which have been cleaned. The bit line conduction layer is patterned so as to form bit lines, which make contact with the N+ junction region 150a, the P+ junction region 160a, the N+ pickup region 150b, the P+ pickup region 160b, and the gates 140, respectively.

Thereafter, a series of conventional processes are further performed so as to complete a sense amplifier of the semiconductor device.

However, the conventional processes have a problem in that the P+ pickup region 160b is partially covered during additional ion implantation, because the mask pattern used for the additional ion implantation (i.e. the third mask pattern M3) has the same shape as that of the second mask pattern M2. This means that additional ion implantation is not performed to a portion of the second insulation interlayer, which corresponds to the covered part of the P+ pickup region 160b.

When the P+ pickup region 160b has a part which has not been subjected to additional ion implantation, the amount of loss of thickness of the second insulation interlayer occurring on the part which has been subjected to additional ion implantation differs from that occurring on the part which has not, when the bit line contact holes 170 are cleaned in a subsequent process. This is because the part that has been subjected to additional ion implantation has a faster loss rate during cleaning due to damage resulting from ions.

As a result, a stepped portion is created on the second insulation interlayer before a bit line conduction layer is deposited. Although such a stepped portion causes little problem in the case of a device having a line width of at least 100 nm, it is problematic in the case of a highly-integrated device having a line width of less than 100 nm. Particularly, high integration of devices decreases the line width of bit lines, as well as the spacing between them. Consequently, the process for patterning the bit line conduction layer becomes more difficult. The stepped portion on the second insulation interlayer degrades the degree of surface flatness of the bit line conduction layer. This decreases the DOF (depth of focus) margin during an exposure process for forming bit lines and, as a result, causes defective patterning, such as bridging between bit lines.

FIG. 2 is a sectional view taken along line a-a' of FIG. 1E and shows a stepped portion, which has been created on the second insulation interlayer ILD2 when the bit line contact holes 170 are cleaned, after the bit line conduction layer 180 is deposited, but before the bit line conduction layer 180 is patterned. Reference numeral ILD1 refers to the first insulation interlayer.

SUMMARY OF THE INVENTION

Accordingly, an object of the present invention is to provide a method for preventing bit lines from being bridged to each other by a stepped portion created on an insulation interlayer due to irregular density of a P-type impurity, which is ion-implanted into an insulation interlayer in a P+ pickup region when a sense amplifier of a semiconductor device is formed.

In order to accomplish this object, there is provided a method for forming a sense amplifier of a semiconductor device including the steps of providing a semiconductor substrate having an NMOS and a PMOS for a sense amplifier formed on the substrate, a P+ pickup and an N+ pickup formed on the substrate between the NMOS and the PMOS as parallel bars, and an insulation layer formed on the substrate between the NMOS and the P+ pickup, between the P+ pickup and the N+ pickup, and between the N+ pickup and the PMOS so that a portion of the insulation layer formed between the P+ pickup and the N+ pickup is bridged to a portion of the insulation layer formed in other regions; forming an insulation interlayer on the insulation layer so as to cover the NMOS, the PMOS, the P+ pickup, and the N+ pickup; etching the insulation interlayer so as to form contact holes for exposing a junction region of the NMOS, a junction region of the PMOS, the P+ pickup, the N+ pickup, and gates, respectively; forming a mask pattern on the substrate, the contact holes having been being formed on the substrate, the mask pattern having hole-type openings for selectively exposing the contact holes in the junction region of the PMOS and in a region of the P+ pickup; performing ion implantation of a P-type impurity in the junction region of the PMOS exposed by the contact holes and in the region of the P+ pickup exposed by the contact holes by using the mask pattern as an ion implantation barrier; removing the mask pattern; cleaning the substrate, the mask pattern having been removed from the substrate; and forming bit lines on the insulation interlayer so as to fill the contact holes.

The mask pattern having hole-type openings is formed by using ArF exposure equipment.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1A:
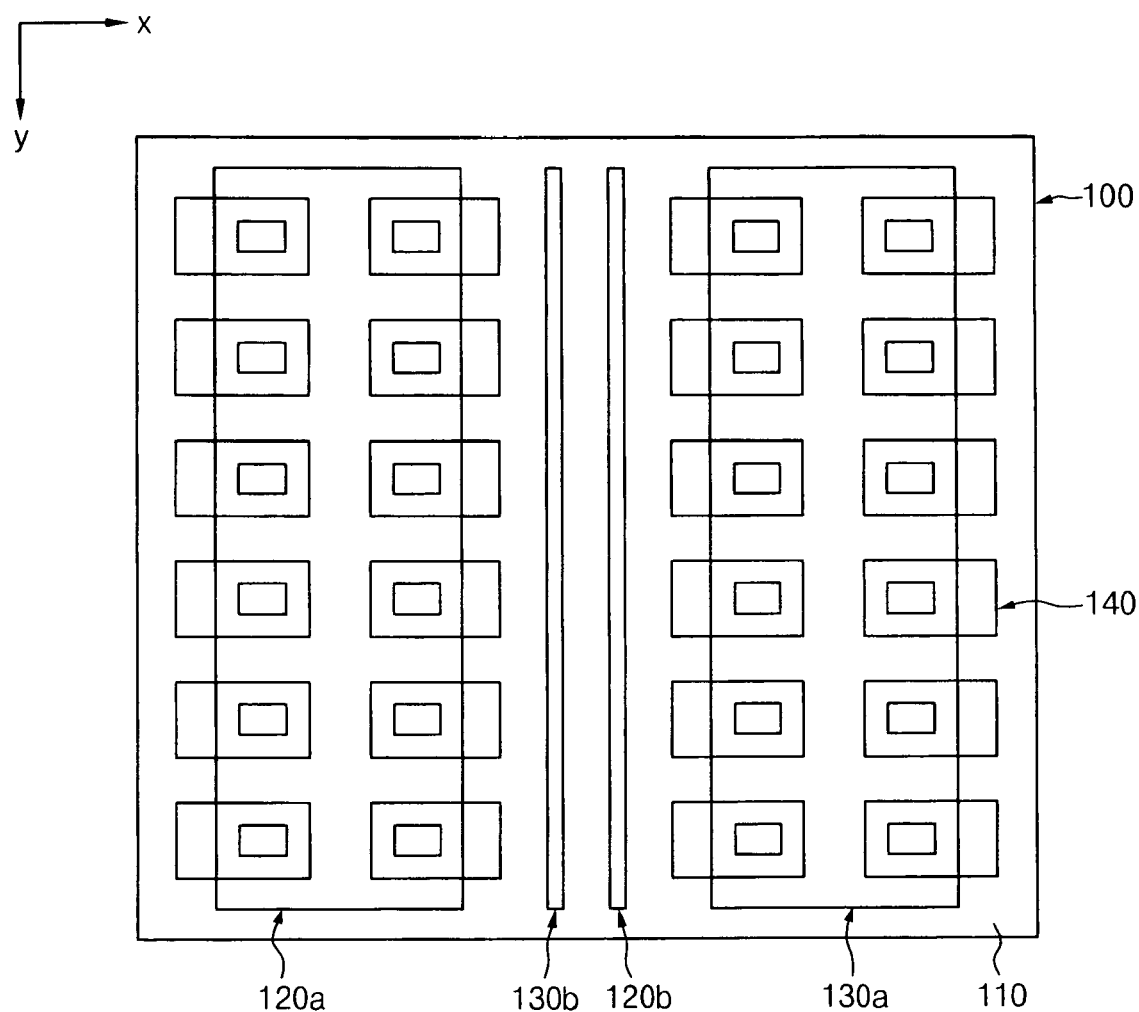
FIGS. 1A and 1E are top views showing steps of a prior art process for forming a sense amplifier of a semiconductor device, respectively.
Figure 1B:
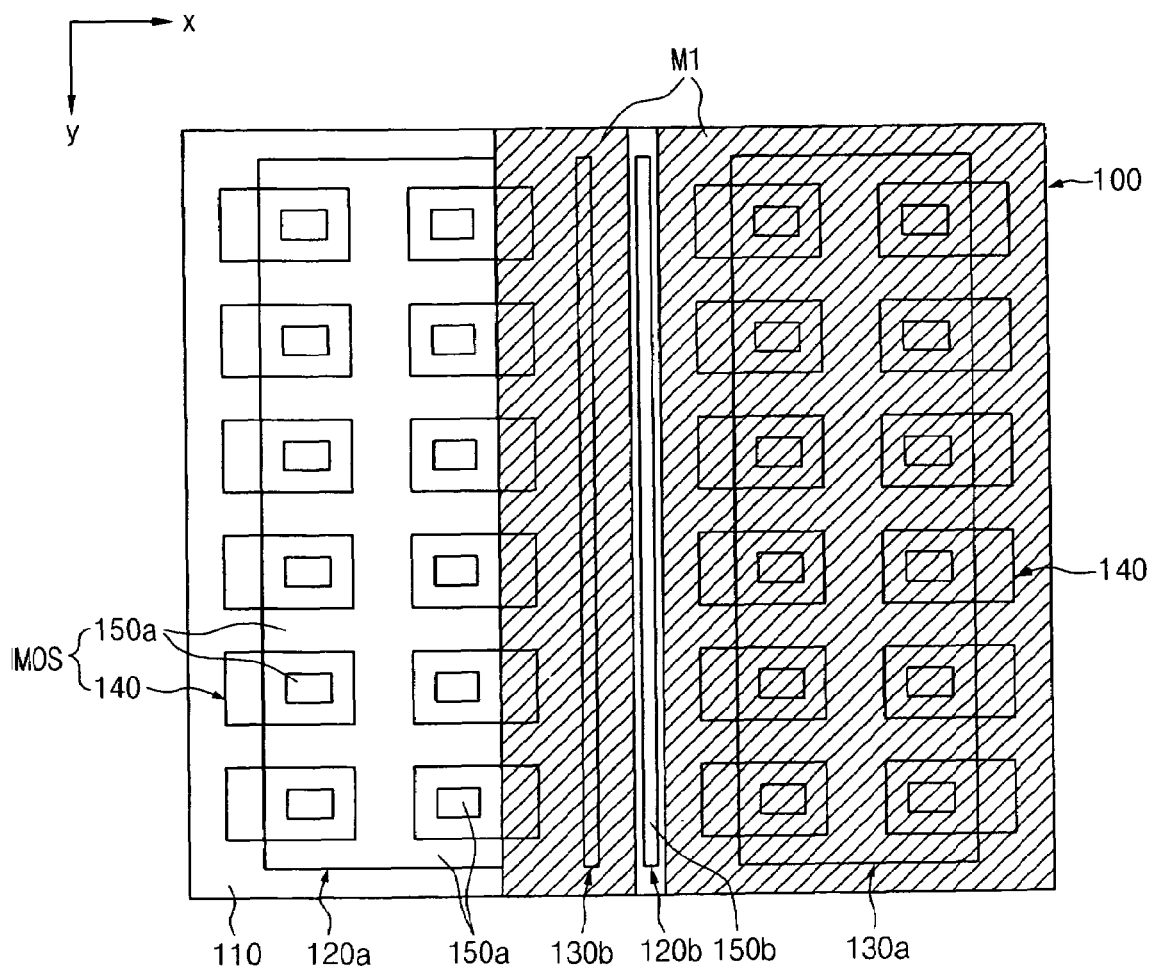
Figure 1C:
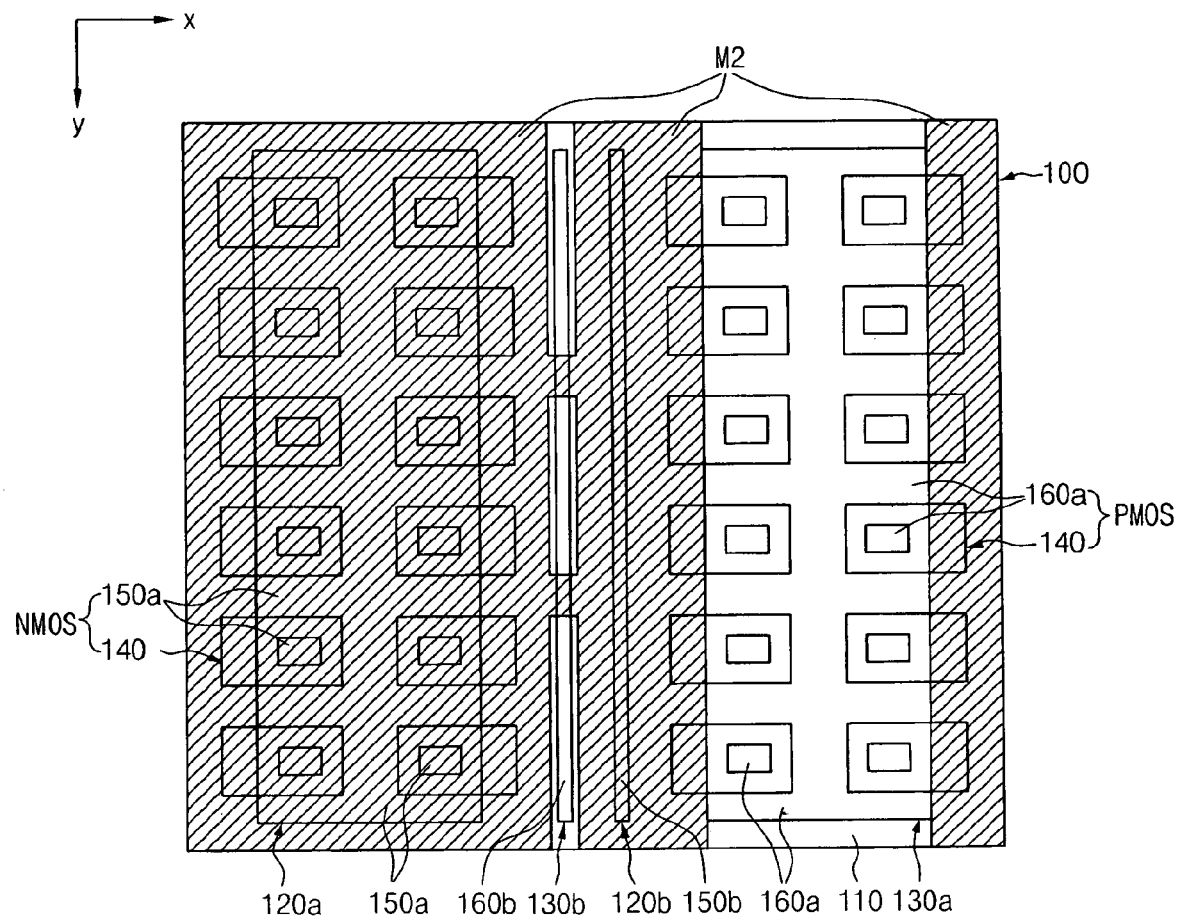
Figure 1D:
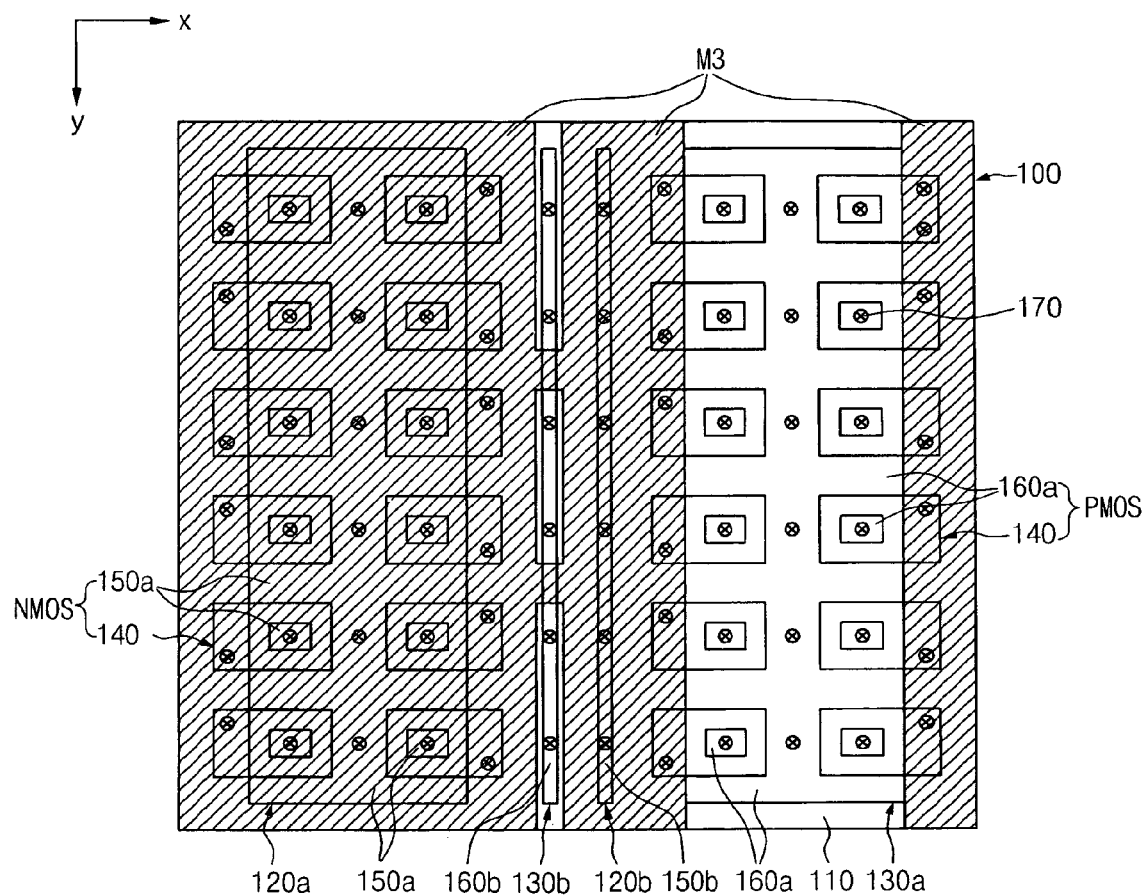
Figure 1E:
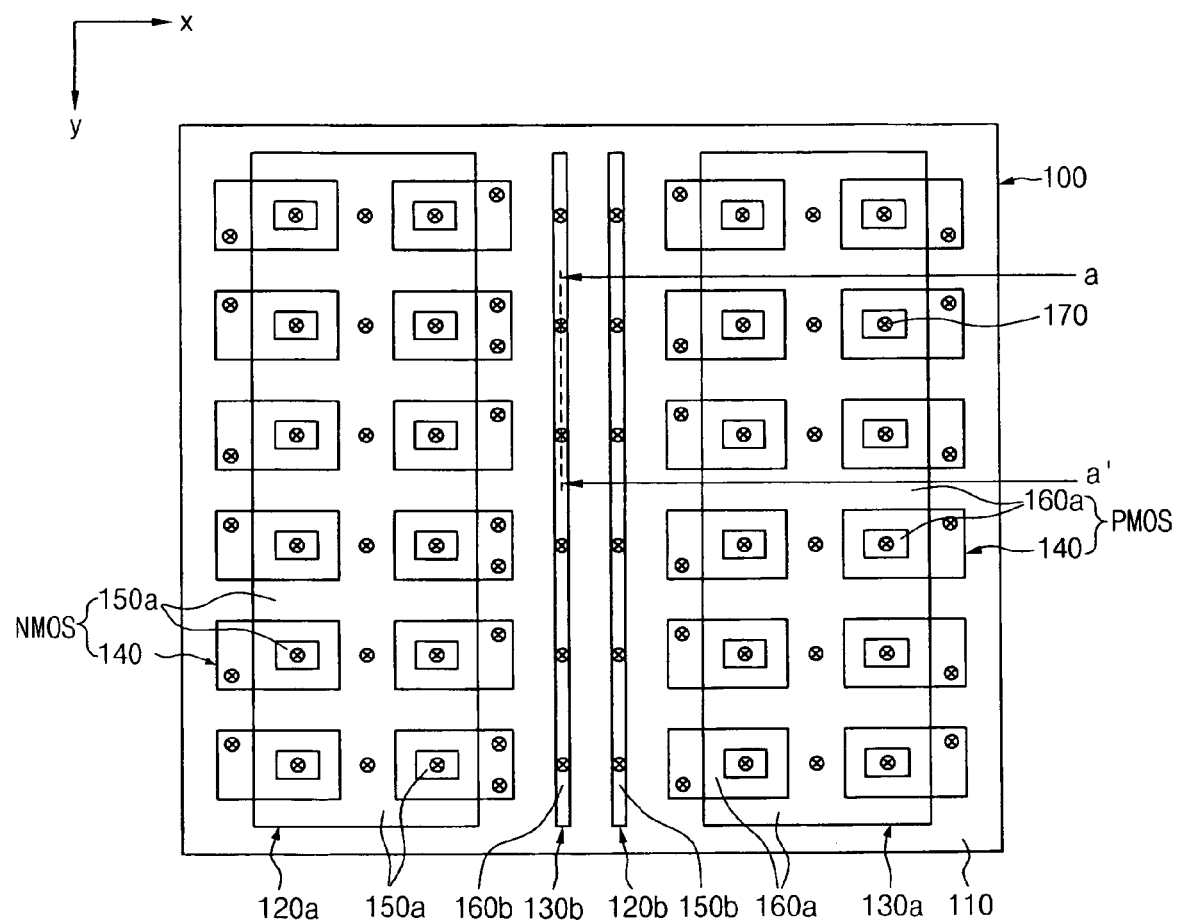
Figure 2:
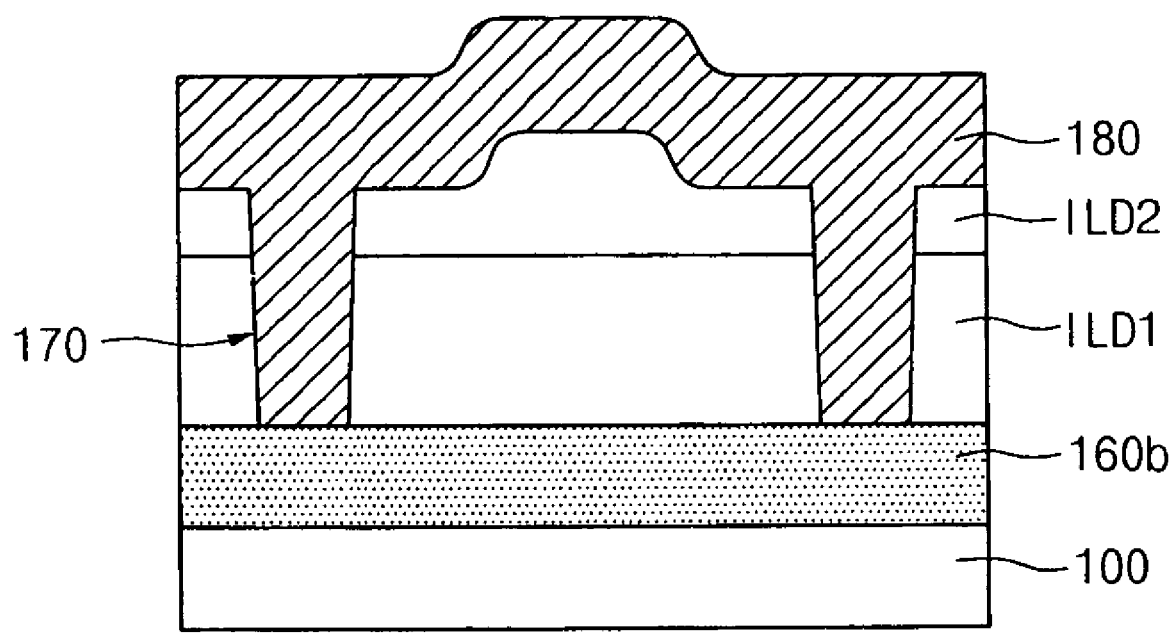
FIG. 2 is a sectional view of a semiconductor device for illustrating a problem occurring in the prior art.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 3A:
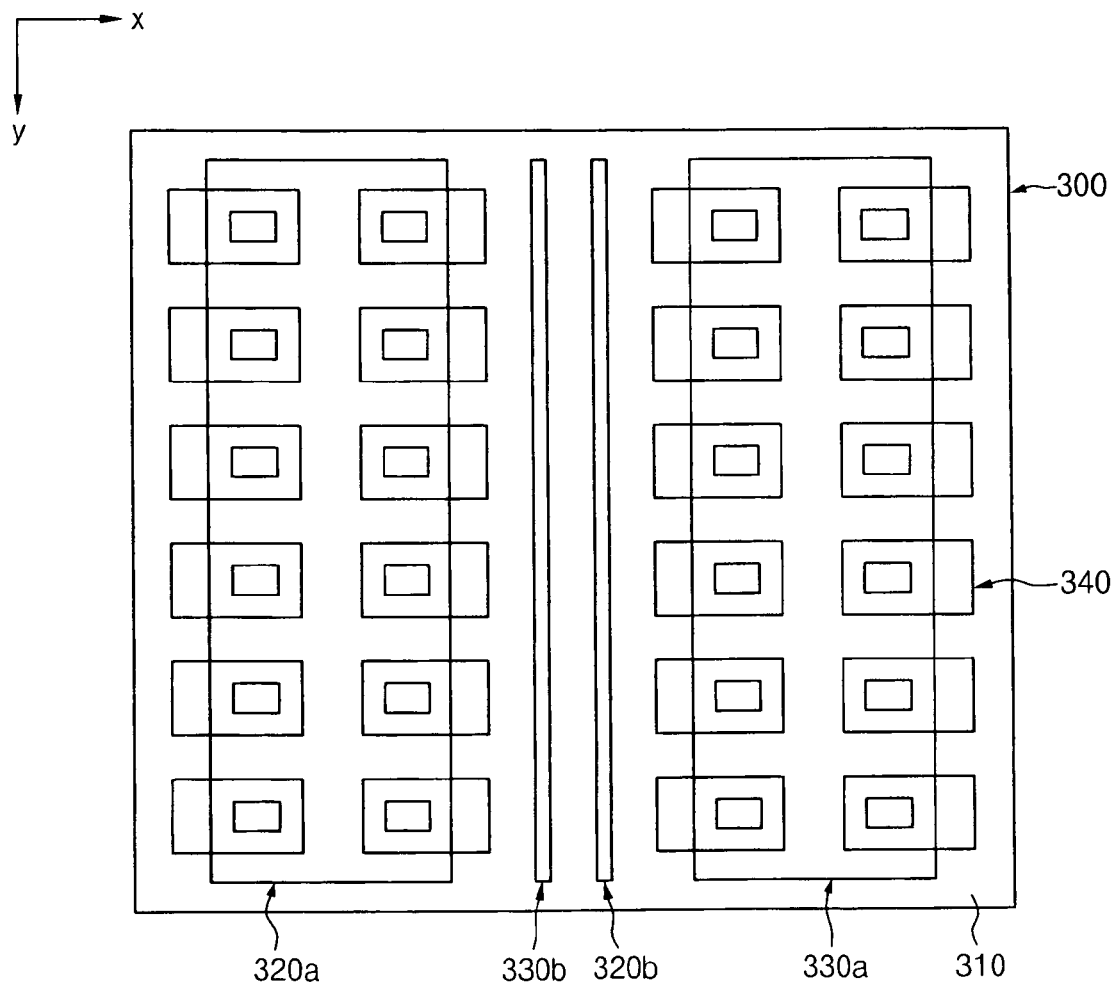
FIGS. 3A and 3E are top views showing a series of processes of a method for forming a sense amplifier of a semiconductor device according to an embodiment of the present invention, respectively.
Figure 3B:
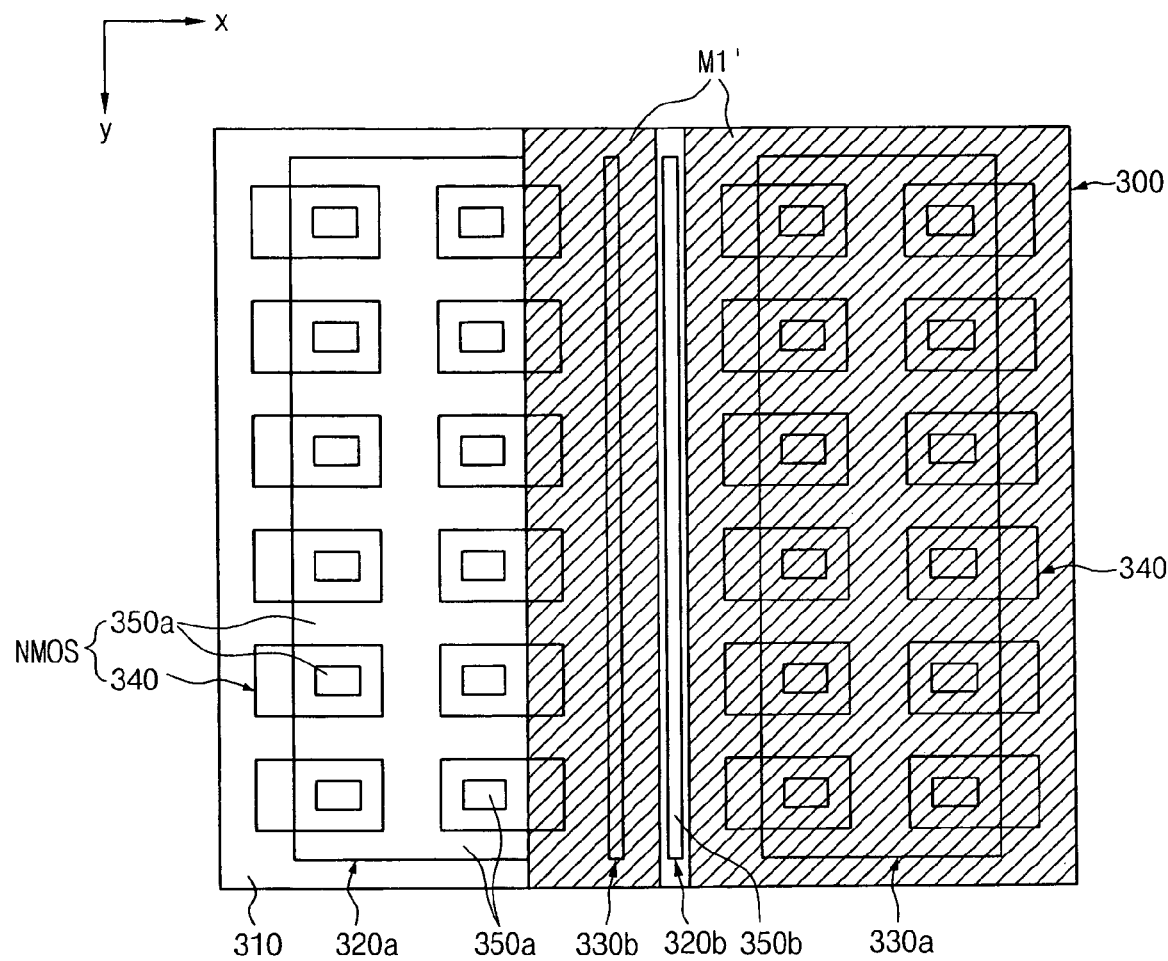
Figure 3C:
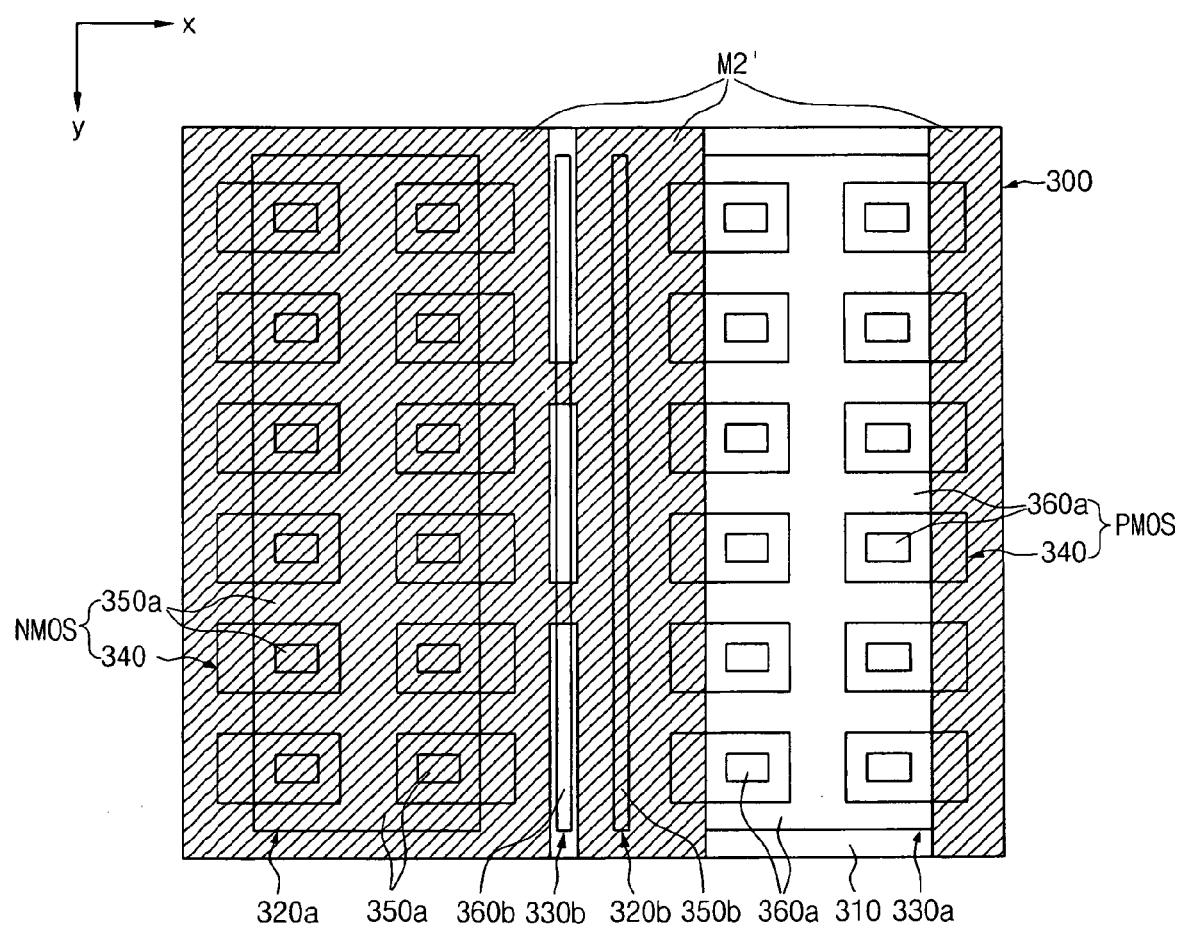
Figure 3D:
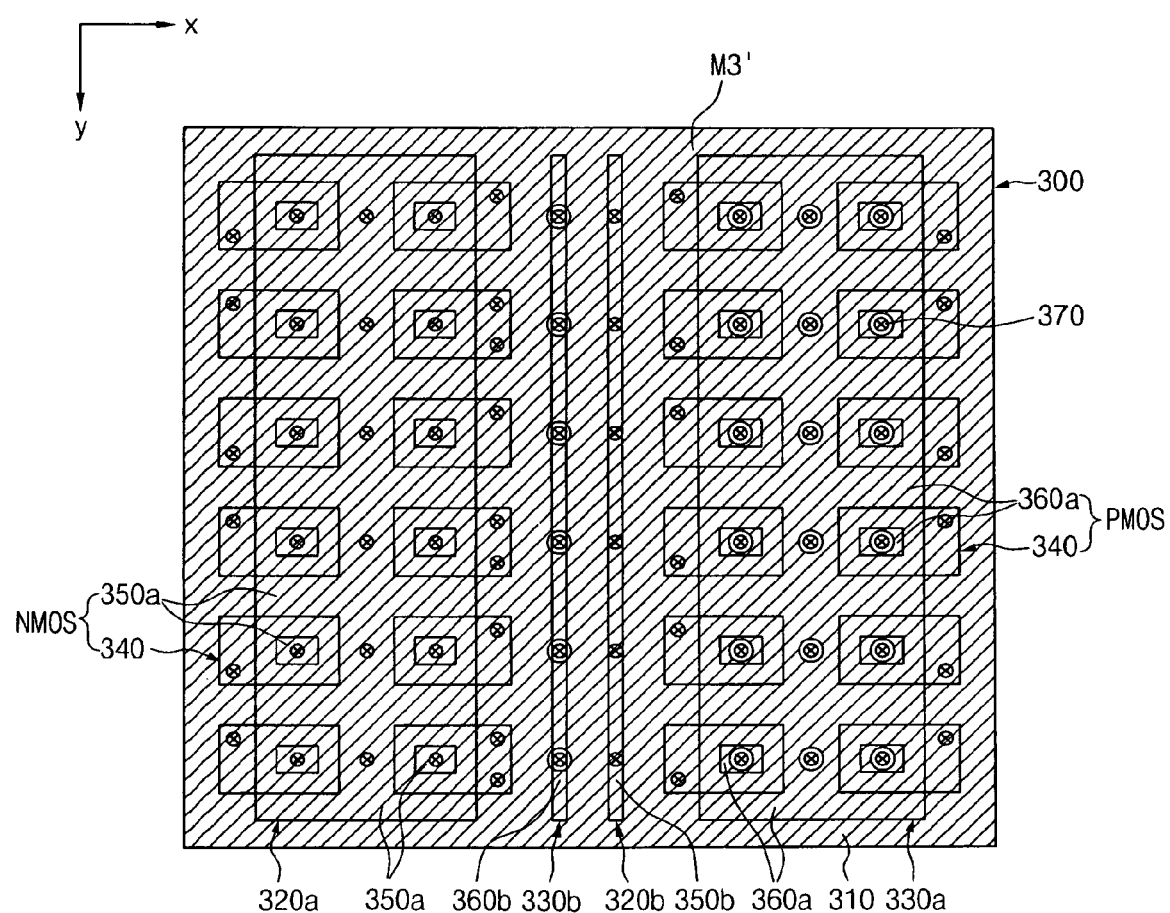
Figure 3E:
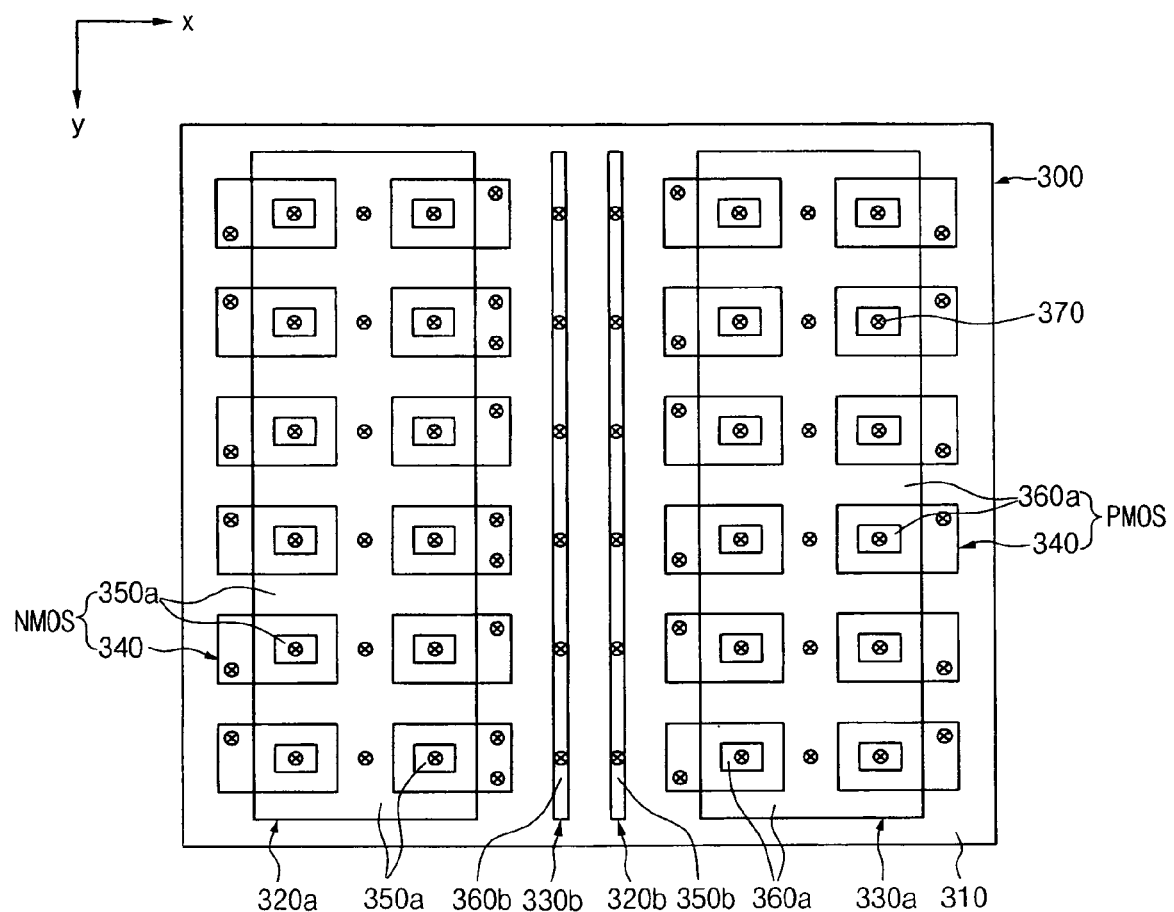

FIGS. 3A and 3E are top views showing a series of processes of a method for forming a sense amplifier of a semiconductor device, respectively.

Referring to FIG. 3A, a device isolation layer 310 is formed in a sense amplifier formation region of a semiconductor substrate 300 so that an active region for forming a sense amplifier is delimited. The active region includes an NMOS formation region 320a, a PMOS formation region 330a, an N+ pickup formation region 320b, and a P+ pickup formation region 330b.

A gate insulation layer, a gate conduction layer, and a hard mask layer are laminated on the substrate 300 so as to form N-type gates 340 in a ring shape. Particularly, the gates 340 are formed in the NMOS and PMOS formation regions 320a and 330a, and those of the gates 340 formed on the device isolation layer 310 outside the active region are supposed to have contacts between the gates 340 and a wiring.

Referring to FIG. 3B, a buffer oxide layer (not shown) and a spacer nitride layer (not shown) are successively formed on the front surface of the resulting substrate, which have the gates 340 formed thereon. Then, an insulation layer (not shown) is formed on the spacer nitride layer so as to cover the gates 340. The buffer oxide layer is made of TEOS oxide or HTO (high temperature oxide) and has a thickness of 20-500 Å, and the spacer nitride layer has a thickness of 50-700 Å.

A first mask pattern M1', which has line-type openings for exposing the NMOS formation region 320a and the N+ pickup formation region 320b, is formed on the insulation layer. The insulation layer in the exposed NMOS formation region 320a and N+ pickup formation region 320b is etched by using the first mask pattern M1' as an etching mask. The underlying spacer nitride layer and buffer oxide layer are subjected to anisotropic etching so that spacers (not shown) are formed on lateral walls of the gates 340 while exposing the active region among the gates 140, as well as the N+ pickup formation region 320b.

An N-type impurity is ion-implanted into the active region, which has been exposed among the gates 340 in the NMOS formation region 320a, and into the exposed N+ pickup formation region 320b so as to form an N+ junction region 350a and an N+ pickup region 350b.

Referring to FIG. 3C, the first mask pattern M1' is removed, and a second mask pattern M2', which has line-type openings for selectively exposing the PMOS formation region 330a and a part of the P+ pickup formation region 330b, is formed on the front surface of the resulting substrate. The insulation layer in the exposed PMOS formation region 330a and P+ pickup formation region 330b is etched by using the second mask pattern M2' as an etching mask. The underlying spacer nitride layer and buffer oxide layer are subjected to anisotropic etching so that spacers are formed on the lateral walls of the gates 340 while exposing the active region among the gates 140, as well as the P+ pickup formation region 330b.

A P-type impurity is ion-implanted into the active region, which has been exposed among the gates 340 in the PMOS formation region 330a, and into the exposed P+ pickup formation region 330b so as to form a P+ junction region 360a and an P+ pickup region 360b.

The second mask pattern M2' is designed so as to cover intermediate parts of the P+ pickup formation region 330b so that a pattern of laminated buffer oxide layer, spacer nitride layer, and insulation layer remains on the covered parts. This is for the purpose of connecting a pattern of laminated buffer oxide layer, spacer nitride layer, and insulation layer, which remains to the left of the P+ pickup formation region 330b, to that remaining to the right thereof. The resulting pattern of laminated buffer oxide layer, spacer nitride layer, and insulation layer has a locally H-shaped configuration. The pattern of laminated layers, which remains in x-axis direction, and the pattern, which is elongated in y-axis direction, have a width and a height of 100-5000 Å.

As a result, an NMOS and a PMOS for a sense amplifier are formed. A P+ pickup region 360b and an N+ pickup region 350b are formed on the substrate between the NMOS and PMOS in the shape of parallel bars. An insulation layer is formed on the substrate between the NMOS and the P+ pickup region 360b, between the P+ pickup region 360b and the N+ pickup region 350b, and between the N+ pickup region 350b and the PMOS. Particularly, a portion of the insulation layer formed between the P+ pickup region 360b and the N+ pickup region 350b is bridged to a portion thereof formed between the NMOS and the P+ pickup region 360b, thereby providing a semiconductor substrate.

Referring to FIG. 3D, the second mask pattern M2' is removed, and a first insulation interlayer is formed so as to cover the resulting substrate. The first insulation interlayer is subjected to etch-back or CMP until the gates 340 are exposed. A second insulation interlayer is formed on the first insulation interlayer by using BPSG (borophosphosilicate glass), for example, and its surface is flattened. Predetermined portions of the first and second insulation interlayers are etched so as to form bit line contact holes 370 for exposing the N+ junction region 350a, the P+ junction region 360a, the N+ pickup region 350b, and the P+ pickup region 360b, respectively. In addition, bit line contact holes 370 are also formed so as to expose the gates 340 formed on the device isolation layer 310 outside the active region.

A third mask pattern M3' is formed on the resulting substrate, which has the bit line contact holes 370 formed thereon, in such a manner that the third mask pattern M3' has hole-type openings for selectively exposing the bit line contact holes 370 in the P+ junction region 360a and the P+ pickup region 360b.

In order to form the third mask pattern M3' having hole-type openings, ArF exposure equipment, which uses ArF as its light source, is utilized. This is because conventional I-line exposure equipment cannot form a pattern having fine hole-type openings.

In order to improve the contact resistance, additional ion implantation of a P-type impurity is performed in the P+ junction region 360a and the P+ pickup region 360b, which have been exposed by the bit line contact holes 370, by using the third mask pattern M3' as an ion implantation barrier.

In the case of the prior art, the third mask pattern M3 is designed in the same manner as the second mask pattern M2. Particularly, the third mask pattern M3 covers intermediate parts of the P+ pickup region 160b, so that additional ion implantation is not performed in some regions of the second insulation interlayer above the P+ pickup region 160b. In contrast, the third mask pattern M3' according to the present invention selectively exposes the bit line contact holes 370 only in the P+ junction region 360b and the P+ pickup region 360b, so that additional ion implantation is not performed to the second insulation interlayer formed above the P+ junction region 360a and the P+ pickup region 360b.

Referring to FIG. 3E, the third mask pattern M3' is removed, and a cleaning process is performed so as to remove impurities from inside the bit line contact holes 370. During the cleaning process, the second insulation interlayer outside the bit line contact holes 370 partially loses its thickness.

In the case of the prior art, the amount of loss of thickness of the second insulation interlayer during cleaning is irregular, because additional ion implantation is performed in some regions of the second insulation interlayer above the P+ pickup region 160b, but not in other regions. In contrast, the amount of loss of thickness of the second insulation interlayer during cleaning is uniform according to the present invention, because additional ion implantation is not performed in any region of the second insulation interlayer above the P+ junction region 360a and the P+ pickup region 360b.

Although not shown in the drawings, a bit line conduction layer is deposited on the second insulation interlayer by using tungsten, for example, so as to fill the bit line contact holes 370, which have been cleaned. The bit line conduction layer is patterned so as to form bit lines, which make contact with the N+ junction region 350a, the P+ junction region 360a, the N+ pickup region 350b, the P+ pickup region 360b, and the gates 340, respectively.

Thereafter, a series of conventional processes are further performed so as to complete a sense amplifier of the semiconductor device.

As mentioned above, the third mask M3' for additional ion implantation according to the present invention has hole-type openings for selective exposing the bit line contact holes 370 in the P+ junction region 360a and the P+ pickup region 360b, so that additional ion implantation is not performed to the second insulation interlayer above the P+ junction region 360a and the P+ pickup region 360b. As a result, the second insulation interlayer loses its thickness uniformly in all regions of the P+ junction region 360a and the P+ pickup region 360b, when the bit line contact holes 370 are cleaned. This means that no stepped portion is created on the second insulation interlayer, and the degree of flatness of the bit line conduction layer, which is deposited on the second insulation interlayer, improves. Consequently, the present invention increases the DOF margin of an exposure process when the bit line conduction layer is patterned and prevents the bit lines from being bridged to each other. This improves the yield ratio of semiconductor devices.

The openings of the third mask pattern M3' are preferably larger than the bit line contact holes 370 in consideration of the alignment margin. In this case, a P+ impurity is ion-implanted into a part of the second insulation interlayer on the upper edge of each bit line contact hole 370 during additional ion implantation. As a result, the rate of loss occurring on the ion-implanted parts is larger than that on other parts. However, even when the second insulation interlayer is partially lost on the upper edge of each bit line contact hole 370, a local stepped portion is not created on the second insulation interlayer as in the case of the prior art. Rather, the entrance of each bit line contact hole 370 increases and, advantageously, the contact hole can be filled more easily.

Figure 4A:
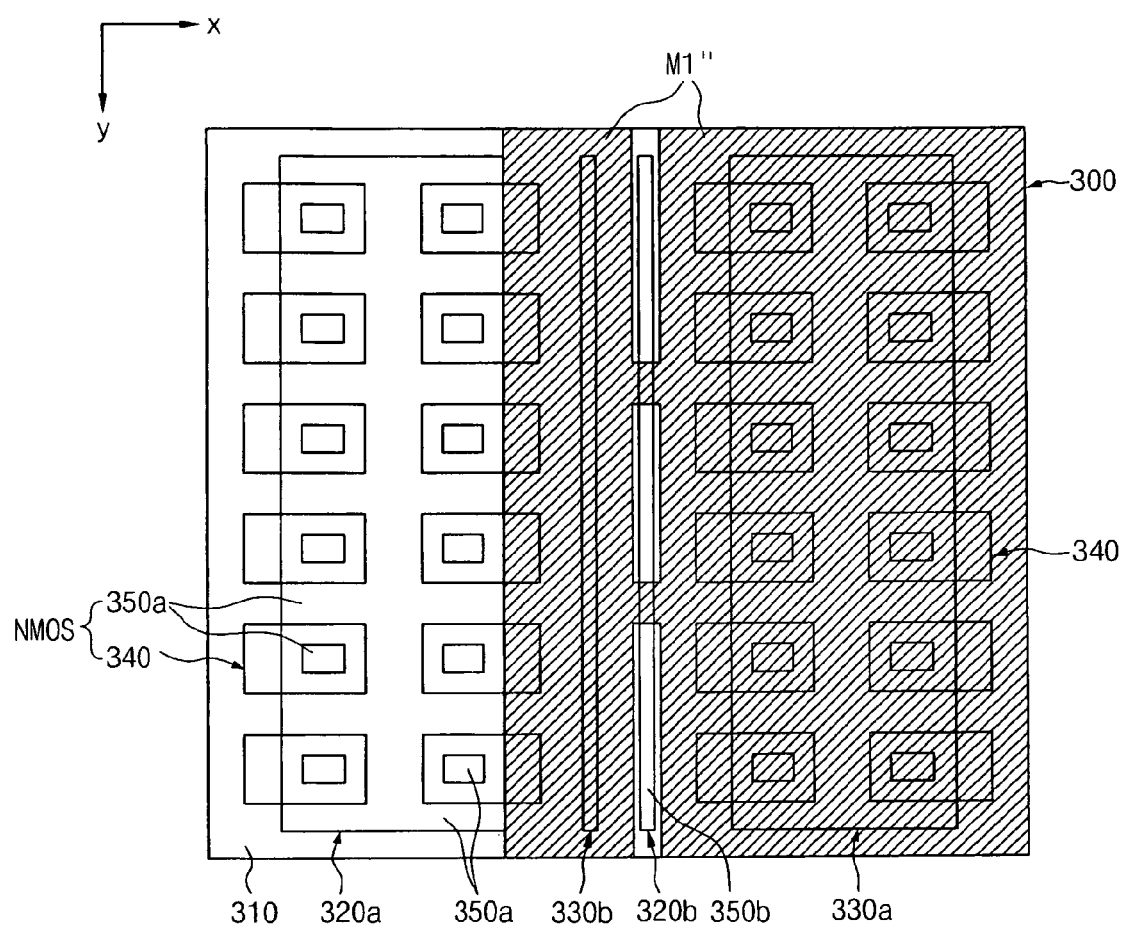
FIGS. 4A to 4C are top views showing another embodiment of the present invention.
Figure 4B:
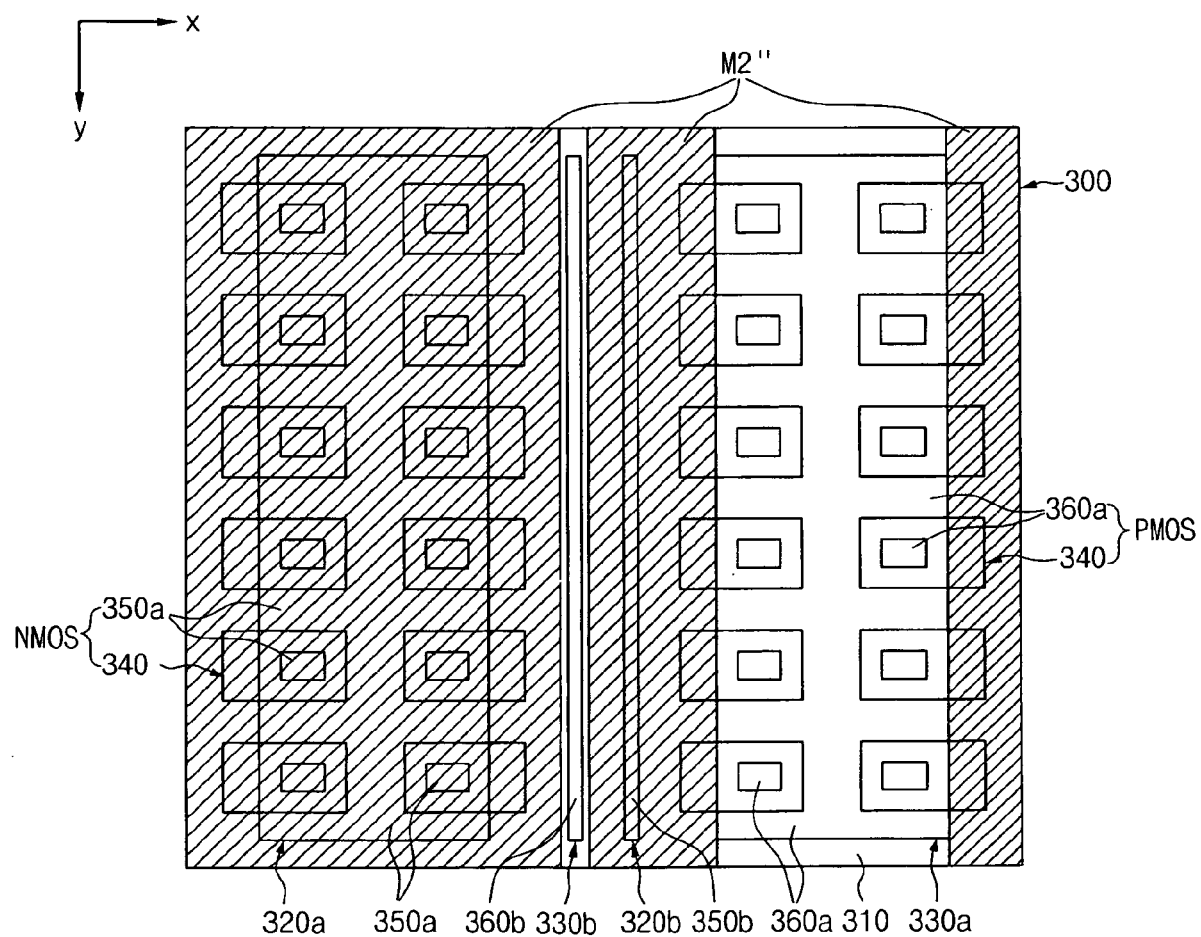
Figure 4C:
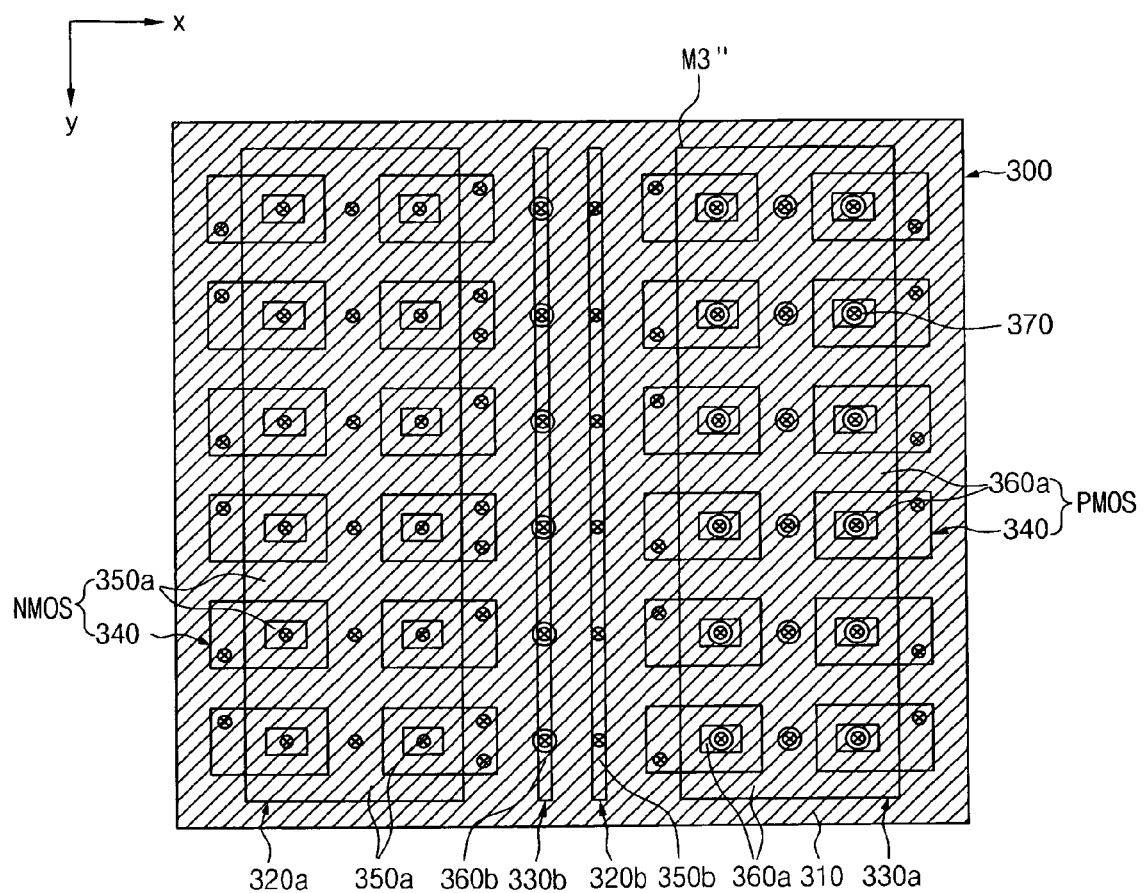

In the above-mentioned embodiment of the present invention, the second mask pattern M2' covers intermediate parts of the P+ pickup region 360b so that the pattern of laminated buffer oxide layer, spacer nitride layer, and insulation layer, which remains between the NMOS region and the P+ pickup region 360b, is bridged to the pattern of laminated buffer oxide layer, spacer nitride layer, and insulation layer, which remains between the P+ pickup region 360b and the N+ pickup region 350b, thereby preventing the patterns from deforming. Alternatively, according to another embodiment of the present invention as shown in FIGS. 4A to 4C, the second mask pattern M2" may leave the P+ pickup region 360b completely exposed and the first mask pattern M1" may cover intermediate parts of the N+ pickup region 350b, so that a pattern of laminated buffer oxide layer, spacer nitride layer, and insulation layer, which remains between the PMOS region and the N+ pickup region 350b, is bridged to a pattern of laminated buffer oxide layer, spacer nitride layer, and insulation layer, which remains between the P+ pickup region 360b and the n+ pickup region 350b, thereby preventing the patterns from deforming. In this case, the third mask pattern M3" has hole-type openings for selectively exposing the bit line contact holes 370 in the P+ junction region 360a and the P+ pickup region 360b. This prevents the bit lines from bridged to each other due to irregular loss of the second insulation interlayer.

Although the present invention has been described and shown with reference to a case wherein additional ion implantation is performed in the P+ junction region 360a and the P+ pickup region 360b, the present invention is not limited to that and is applicable to a case wherein additional ion implantation can be performed in the N+ junction region 350a and the N+ pickup region 350b, for example.

As mentioned above, when a sense amplifier of a semiconductor device is formed according to the present invention, a mask pattern used for additional ion implantation of a P-type impurity has hole-type openings for selectively exposing bit line contact holes in a P+ junction region and a P+ pickup region, so that additional ion implantation is not performed to an insulation interlayer outside the bit line contact holes. This prevents a stepped portion from being created on the insulation interlayer due to irregular additional ion implantation and prevents bit lines from being bridged to each other. As a result, the yield ratio of semiconductor devices is improved.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for forming a sense amplifier of a semiconductor device comprising the steps of:
    providing a semiconductor substrate having an NMOS and a PMOS for a sense amplifier formed on the substrate, a P+ pickup and an N+ pickup formed on the substrate between the NMOS and the PMOS in the shape of parallel bars, and an insulation layer formed on the substrate between the NMOS and the P+ pickup, between the P+ pickup and the N+ pickup, and between the N+ pickup and the PMOS so that a portion of the insulation layer formed between the P+ pickup and the N+ pickup is bridged to a portion of the insulation layer formed in other regions;
    forming an insulation interlayer on the insulation layer so as to cover the NMOS, the PMOS, the P+ pickup, and the N+ pickup;

etching the insulation interlayer so as to form contact holes for exposing a junction region of the NMOS, a junction region of the PMOS, the P+ pickup, the N+ pickup, and gates, respectively;

forming a mask pattern on the substrate, the contact holes being formed on the substrate, the mask pattern having hole-type openings for selectively exposing the contact holes in the junction region of the PMOS and in a region of the P+ pickup;

performing ion implantation of a P-type impurity in the junction region of the PMOS exposed by the contact holes and in the region of the P+ pickup exposed by the contact holes by using the mask pattern as an ion implantation barrier;

removing the mask pattern;

cleaning the substrate, the mask pattern having been removed from the substrate; and forming bit lines on the insulation interlayer so as to fill the contact holes.

2. The method as claimed in claim 1, wherein the mask pattern having hole-type openings is formed by using ArF exposure equipment.

3. A semiconductor device having a sense amplifier, the semiconductor device comprising:

a semiconductor substrate having an NMOS and a PMOS for a sense amplifier formed on the substrate, a P+ pickup and an N+ pickup formed on the substrate between the NMOS and the PMOS in the shape of parallel bars, and an insulation layer formed on the substrate between the NMOS and the P+ pickup, between the P+ pickup and the N+ pickup, and between the N+ pickup and the PMOS so that a portion of the insulation layer formed between the P+ pickup and the N+ pickup is bridged to a portion of the insulation layer formed in other regions;

an insulation interlayer formed on the insulation layer, said insulation layer covering the NMOS, the PMOS, the P+ pickup, and the N+ pickup;

contact holes etched into the insulation interlayer that expose a junction region of the NMOS, a junction region of the PMOS, the P+ pickup, the N+ pickup, and gates, respectively;

P-type impurities implanted in the junction region of the PMOS exposed by the contact holes and in the region of the P+ pickup exposed by the contact holes; and bit lines formed on the insulation interlayer so as to fill the contact holes.

4. The semiconductor device of claim 3 wherein impurities are implanted using a mask pattern as an ion implantation barrier.

* * * * *